United States Patent
Kao et al.

(10) Patent No.: US 9,923,530 B2
(45) Date of Patent: Mar. 20, 2018

(54) MATCHING NETWORK CIRCUIT AND RADIO-FREQUENCY POWER AMPLIFIER WITH ODD HARMONIC REJECTION AND EVEN HARMONIC REJECTION AND METHOD OF ADJUSTING SYMMETRY OF DIFFERENTIAL SIGNALS

(71) Applicant: MEDIATEK INC., Hsin-Chu (TW)

(72) Inventors: Jui-Chih Kao, New Taipei (TW); Ming-Da Tsai, Miaoli County (TW); Po-Sen Tseng, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/287,761

(22) Filed: Oct. 7, 2016

(65) Prior Publication Data

US 2017/0149394 A1 May 25, 2017

Related U.S. Application Data

(60) Provisional application No. 62/259,668, filed on Nov. 25, 2015.

(51) Int. Cl.
*H03H 7/38* (2006.01)
*H03F 3/45* (2006.01)
(Continued)

(52) U.S. Cl.
CPC ....... *H03F 3/45076* (2013.01); *H03F 1/3211* (2013.01); *H03F 1/565* (2013.01); *H03F 3/19* (2013.01); *H03F 3/211* (2013.01); *H03F 3/26* (2013.01); *H03F 3/45071* (2013.01); *H03H 7/38* (2013.01); *H03H 7/40* (2013.01);
(Continued)

(58) Field of Classification Search
CPC .............. H01P 1/22; H01P 1/201; H03H 7/38
USPC ........... 333/32, 33, 124, 81 R; 330/295, 302, 330/124 R, 28 R
See application file for complete search history.

(56) References Cited

U.S. PATENT DOCUMENTS 6,658,265 B1  12/2003  Steel
7,164,315 B2   1/2007  Camnitz
(Continued)

FOREIGN PATENT DOCUMENTS

EP   2 141 798 A1   1/2010
WO  2010038111 A1   4/2010

OTHER PUBLICATIONS

Kumar, Design of Differential Mode Wideband Bandpass Filter with Common Mode Suppression using Modified Branch Line Coupler, May 6, 2015.
(Continued)

*Primary Examiner* — Stephen E Jones
(74) *Attorney, Agent, or Firm* — Winston Hsu

(57) ABSTRACT

A matching network circuit for RF power amplifier circuit capable of odd harmonic rejection and even harmonic rejection in the differential mode and the common mode, respectively. The matching network circuit includes a differential mode filter with a differential resonant frequency and a passive component coupled to a virtual short circuit node at the differential mode filter, wherein a common mode filter with a common resonant frequency includes the differential mode filter and the passive component. As a result, two notch filters with different resonant frequencies are utilized for the common mode and the differential mode, respectively.

9 Claims, 5 Drawing Sheets

(51) Int. Cl.
*H03F 3/19* (2006.01)
*H03F 3/21* (2006.01)
*H03F 1/32* (2006.01)
*H03F 1/56* (2006.01)
*H03F 3/26* (2006.01)
*H03H 7/40* (2006.01)

(52) U.S. Cl.
CPC .. *H03F 2200/171* (2013.01); *H03F 2200/387* (2013.01); *H03F 2200/411* (2013.01); *H03F 2200/451* (2013.01); *H03F 2203/45116* (2013.01)

(56) References Cited

U.S. PATENT DOCUMENTS

| | | | |
|---|---|---|---|
| 7,755,448 B2 | 7/2010 | Zolomy | |
| 7,772,938 B2 * | 8/2010 | Schubert | H03F 3/45475 333/12 |
| 8,680,939 B2 * | 3/2014 | Trautman | H04B 3/14 333/28 R |
| 2014/0185661 A1 | 7/2014 | Chang | |

OTHER PUBLICATIONS

Velez, Design of Differential-Mode Wideband Bandpass Filters with Wide Stop band and Common-Mode Suppression by means of Multisection Mirrored Stepped Impedance Resonators (SIRs), 2015.
Matching Differential Port Devices, Skyworks Solutions, Inc., Oct. 30, 2009.

* cited by examiner

MATCHING NETWORK CIRCUIT AND RADIO-FREQUENCY POWER AMPLIFIER WITH ODD HARMONIC REJECTION AND EVEN HARMONIC REJECTION AND METHOD OF ADJUSTING SYMMETRY OF DIFFERENTIAL SIGNALS

CROSS REFERENCE TO RELATED APPLICATIONS

This application claims the benefit of U.S. Provisional Application No. 62/259,668, filed on Nov. 25, 2015, the contents of which are incorporated herein.

BACKGROUND

Differential modes operation is usually used for common mode noise suppression. It can be used in many circuits such as a power amplifier (PA), a low noise amplifier (LNA), a mixer, and so on. However, the differential operation is not the mechanism for supporting multiple communication standards or multiple frequency bands.

The power amplifier is often required to provide a high swing and a low output impedance at its output, so matching networks or circuits are required to provide proper impedance transformation for multiple frequency bands in order to reach low output impedance at its output in different modes. In addition, mismatch and asymmetry (e.g., amplitude difference and/or phase difference) between the differential signals can degrade the output performance of the power amplifier.

Therefore, there is a need to design a matching network circuit and related matching network and power amplifier to achieve odd harmonic rejection in the differential mode, even harmonic rejection in the common mode, and symmetry improvement, so as to ensure the output performance of the power amplifier.

SUMMARY

It is therefore an objective of the present invention to provide a matching network circuit and radio-frequency power amplifier capable of odd harmonic rejection and even harmonic rejection and method of adjusting symmetry of differential signals.

The present invention discloses a matching network circuit for RF power amplifier circuit capable of odd harmonic rejection and even harmonic rejection in the differential mode and the common mode, respectively. The matching network circuit includes a differential mode filter with a differential resonant frequency and a passive component coupled to a virtual short circuit node at the differential mode filter, wherein a common mode filter with a common resonant frequency includes the differential mode filter and the passive component. As a result, two notch filters with different resonant frequencies are utilized for the common mode and the differential mode, respectively.

The present invention further discloses a method for adjusting the symmetry of the differential signals in the radio-frequency power amplifier. The method includes detecting power of the differential signals at the symmetry node of the matching network circuit, generating at least one control signals according to the detected power, and adjusting the phase difference and amplitude difference between the differential signals in the stages (e.g., input, driver and core stages) prior to the matching stage where the matching network provides impedance tuning and matching. Therefore, the symmetry of the differential signals can be improved to reach better output performance of the RF power circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
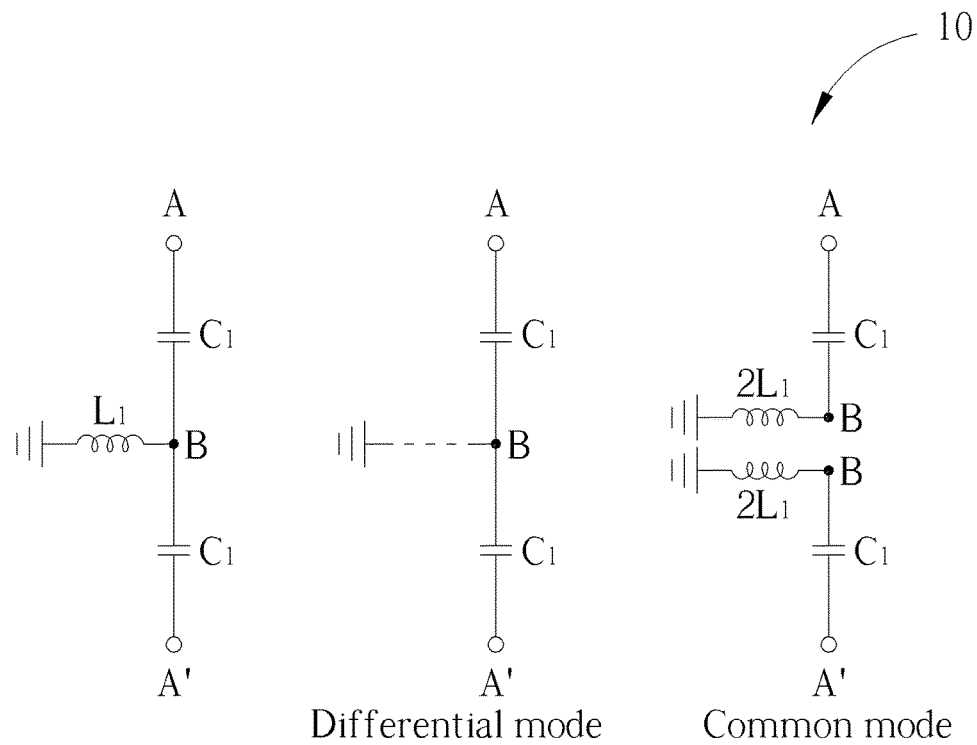
FIG. 1 illustrates a schematic diagram of a matching network circuit and corresponding equivalent circuits in differential mode and common mode.

FIG. 1 illustrates a schematic diagram of a matching network circuit 10 and corresponding equivalent circuits in differential (odd) mode and common (even) mode. The matching network circuit 10 is utilized in a radio-frequency (RF) amplifier, and includes two capacitors $C_1$, an inductor $L_1$, differential input nodes A and A', and a node B. An RF input signal is split into either two identical signals in the common mode or two signals with 180-degree out-of-phase from one another in the differential mode, to be inputted in the differential input nodes A and A', respectively. The matching network circuit 10 is structurally symmetric about the node B. The capacitors $C_1$ are coupled between the node B and the differential input nodes A and A' respectively, and the inductor $L_1$ is coupled between the node B and a ground.

In the differential mode, because of presence of perfect electric wall at the node B, the node B operates as a virtual short circuit or virtual ground, thereby the centrally loaded components $L_1$ at the node B becomes short-circuited. In such a situation, the inductor $L_1$ can be neglected since both ends thereof are short-circuited, so half of the matching network circuit 10 is equivalent to the capacitor $C_1$ coupled to the ground (or zero amplitude). The capacitor $C_1$ can be shunted to another inductor to form an LC resonator or a lowpass filter, and an LC value of the LC resonator can be determined according to a fundamental frequency of the differential RF input signal for impedance matching.

In the common mode, because of presence of perfect magnetic wall at the node B, the node B operates as a virtual open circuit, thereby the centrally loaded component $L_1$ at the node B becomes open-circuited. Moreover, an overall electrical length of the centrally loaded component $L_1$ at the node B is increased due to the virtual open circuit, where the inductor $L_1$ is equivalent to two parallel inductors with double inductance of the inductor $L_1$. In such a situation, half of the matching network circuit 10 is equivalent to the capacitor $C_1$ in series with double the inductor $L_1$ coupled to the ground, and operates as an LC resonator or a notch filter with a common mode resonant frequency, which can be denoted as the equation (1.1).

$$\omega_{L,even} = \frac{1}{\sqrt{2L_1 C_1}} \quad (1.1)$$

where $\omega_{L,even}$ (represents the common mode resonant angular frequency which is denoted as $2\pi f$, where f represents frequency. Note that the term. "resonant frequency" represents the "resonant angular frequency" in this patent.

According to the equation (1.1), even harmonics of the RF input signal with the common mode resonant frequency can be filtered out or rejected in the common mode.

Figure 2:
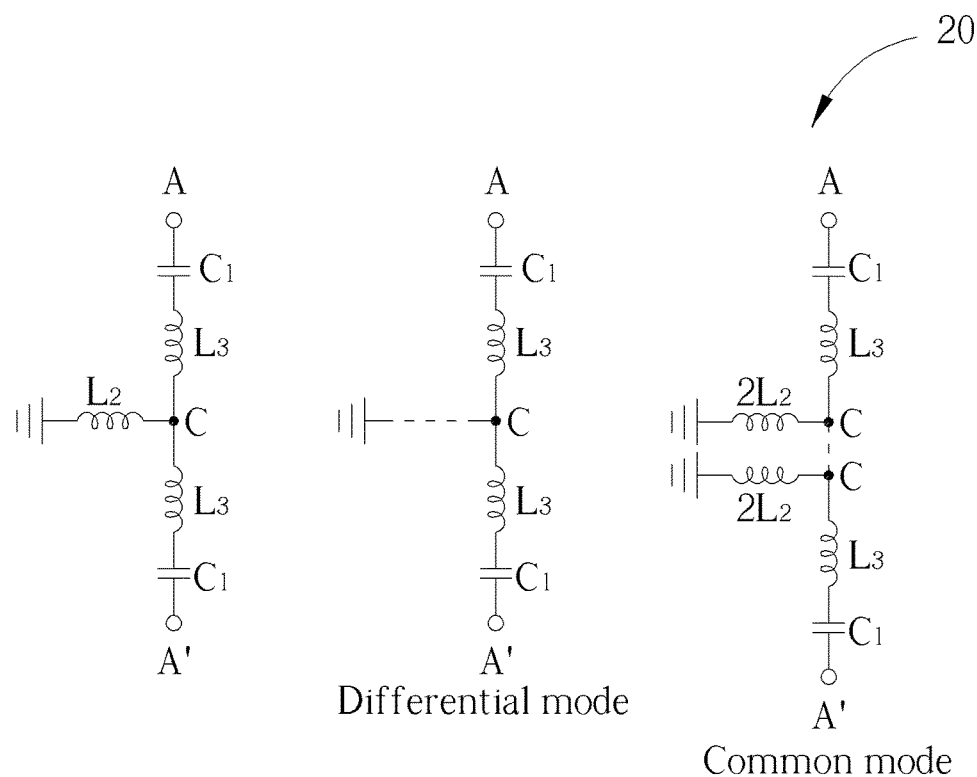
FIG. 2 illustrates a schematic diagram of a matching network circuit and corresponding equivalent circuits in differential mode and common mode according to an embodiment of the present invention.

FIG. 2 illustrates a schematic diagram of a matching network circuit 20 and corresponding equivalent circuits in differential mode and common mode according to an embodiment of the present invention. The matching network circuit 20 is utilized in a radio-frequency (RF) amplifier, and includes the two capacitors $C_1$, an inductor $L_2$, two inductors $L_3$, the differential input nodes A and A', and a node C. The RF input signal is split into either two identical signals in the common mode or two signals with 180-degree out-of-phase from one another in the differential mode, to be inputted in the differential input nodes A and A' respectively. The matching network circuit 20 is structurally symmetric about the node C. The capacitors $C_1$ are coupled between the inductors $L_3$ and the differential input nodes A and A' respectively, the inductors $L_3$ are coupled between the capacitors $C_1$ and the node C respectively, and the inductor $L_2$ is coupled between the node C and the ground.

In the differential mode, because of presence of perfect electric wall at the node C, the node C operates as a virtual short circuit or virtual ground, thereby the centrally loaded component $L_2$ at the node C becomes short-circuited. In such a situation, the inductor $L_2$ can be neglected since both ends thereof are short-circuited, so half of the matching network circuit 20 is equivalent to the capacitor $C_1$ in series with the inductor $L_3$ coupled to the ground. In such a situation, half of the matching network circuit 20 operates as an LC resonator or a notch filter with a differential mode resonant frequency.

In the common mode, because of presence of perfect magnetic wall at the node C, the node C behaves as a virtual open circuit, thereby the centrally loaded component $L_2$ at the node C becomes open-circuited. Moreover, an overall electrical length of the centrally loaded component $L_2$ at the node C is increased due to the virtual open circuit, where the inductor $L_2$ is equivalent to two parallel inductors with double inductance of the inductor $L_2$. In such a situation, half of the matching network circuit 20 is equivalent to the capacitor $C_1$ in series with the inductor $L_3$ and double of the inductor $L_2$ coupled to the ground, and operates as an LC resonator or a notch filter with a common mode resonant frequency.

The common mode resonant frequency and the differential mode resonant frequency for half of the matching network circuit 20 can be respectively denoted as the equations (2.1) and (2.2).

$$\begin{cases} \omega_{L,even} = \frac{1}{\sqrt{(2L_2 + L_3)C_1}} \\ \omega_{H,odd} = \frac{1}{\sqrt{L_3 C_1}} \end{cases} \quad (2.1; 2.2)$$

where $\omega_{L,even}$ is the common mode resonant frequency, $\omega_{H,odd}$ is the differential mode resonant frequency.

According to the equations (2.1) and (2.2), even harmonics of the RF input signal with the common mode resonant frequency can be filtered out or rejected in the common mode, and odd harmonics of the RF input signal with the differential mode resonant frequency can be filtered out or rejected in the differential mode. Therefore, the matching network circuit 20 achieves odd harmonic rejection and even harmonic rejection in the differential mode and the common mode, respectively.

Note that the common mode resonant frequency is lower than the differential mode resonant frequency. In detail, according to the equations (2.1) and (2.2), the resonant frequency is negatively proportional to an effective inductance based on the same capacitance of the capacitor $C_1$. The effective inductance $(2L_2+L_3)$ for even harmonic rejection is higher than the effective inductance $L_3$ for odd harmonic rejection, which makes the common mode resonant frequency to be lower than the differential mode resonant frequency.

Further, given a ratio k of the inductances of the inductors $L_2$ and $L_3$, wherein the ratio k is a real number to be adjustable according to practical requirements. Based on the equations (2.1) and (2.2), the ratio k is rewritten in the equation (2.3).

$$\frac{L_2}{L_3} = \frac{\omega_{H,odd}^2 - \omega_{L,even}^2}{2\omega_{L,even}^2} = k \quad (2.3)$$

According to the equation (2.3), once the target resonant frequencies for odd and even harmonic rejections are determined, the ratio k can be determined, and the inductances of the inductor $L_2$ and $L_3$ can be designed based on the capacitance of the capacitor $C_1$ (which is given based on the impedance matching for the fundamental frequency).

Given that the capacitance of the capacitor $C_1$ and the common mode resonant frequency are the same in both the matching network circuits 10 and 20, and a condition is derived according to the equation (1.1) and the equation (2.1), which is denoted as the equation (2.4).

$$2L_1 = 2L_2 + L_3 \quad (2.4)$$

The inductances of the inductor $L_2$ and $L_3$ can be described by the ratio k and the inductance of the inductor $L_1$ in the equations (2.5) and (2.6), respectively.

$$\begin{cases} L_2 = \frac{2k}{2k+1} L_1 \\ L_3 = \frac{2}{2k+1} L_1 \end{cases} \quad (2.5; 2.6)$$

According to the equations (2.4), (2.5) and (2.6), for half of the matching network circuit 20, a total required inductance for the common mode resonant frequency is denoted as $$L_2 + 2L_3 = \frac{2k+4}{2k+1}L_1.$$

In the matching network circuit 10, there is only one notch filter created for the common mode, which is realized by the capacitor $C_1$ and the inductor $L_1$. In comparison, in the matching network circuit 20, two notch filters are created respectively for the common mode and the differential mode, which are realized by the capacitor $C_1$ and the inductors $L_2$ and $L_3$. Specifically, a notch filter for the common mode is realized by the capacitor $C_1$ and the inductors $L_2$ and $L_3$, and another notch filter for the differential mode is realized by the capacitor $C_1$ and the inductor $L_3$.

From another point of view, since the symmetry node of the matching network circuit operates as the virtual short circuit in the differential mode and operates as the virtual open circuit in the common mode, the electrical characteristics of the central loaded component (e.g., passive component) is changed between the differential mode and the common mode. With this change, the shunted LC resonator constituted by the capacitor $C_1$ and the inductor $L_3$ operates as a differential mode filter with a differential resonant frequency, and the central loaded component (i.e., the inductor $L_2$ coupled between the ground and the virtual short node C at the differential mode notch filter) and the differential mode filter constitute a common mode filter with a common resonant frequency. As a result, the matching network circuit can achieve odd harmonic rejection and even harmonic rejection in the differential mode and the common mode, respectively.

The inductances and capacitances of the components comprised in the matching network circuit can be properly selected according to the equations (2.1) to (2.6) and further taking any matching conditions and rejection conditions into considerations for various applications and target frequencies, which is not limited.

Figure 3:
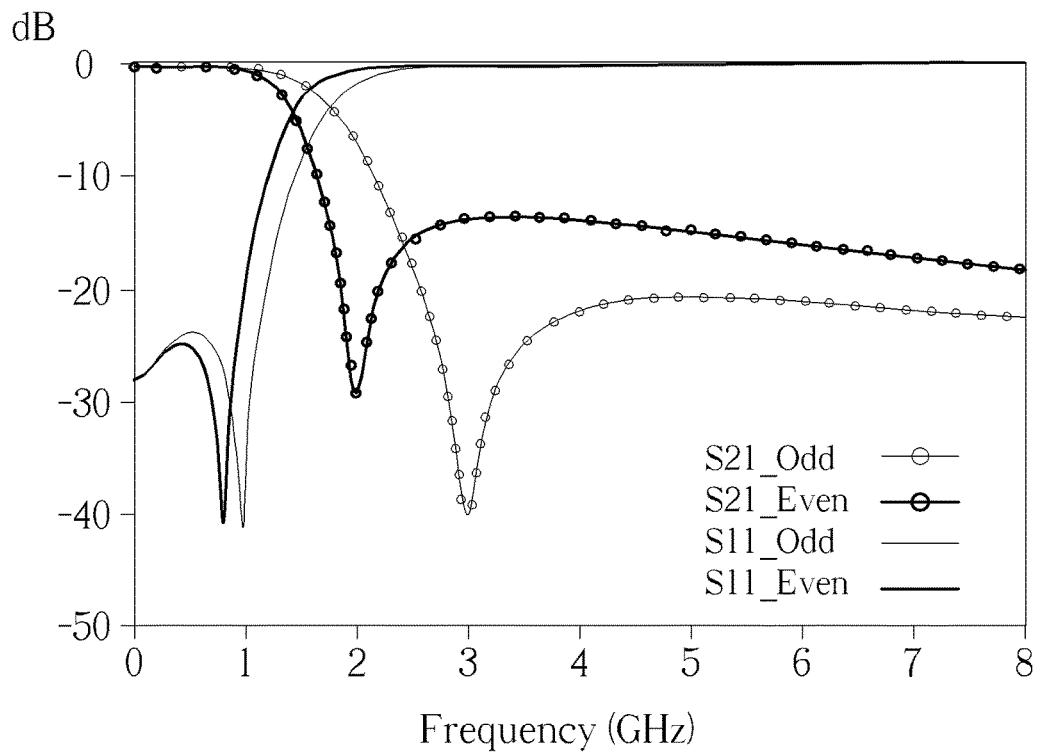
FIG. 3 and FIG. 4 illustrate frequency response simulations of the matching network circuit corresponding to selective inductances and capacitances according to different embodiments of the present invention.
Figure 4:
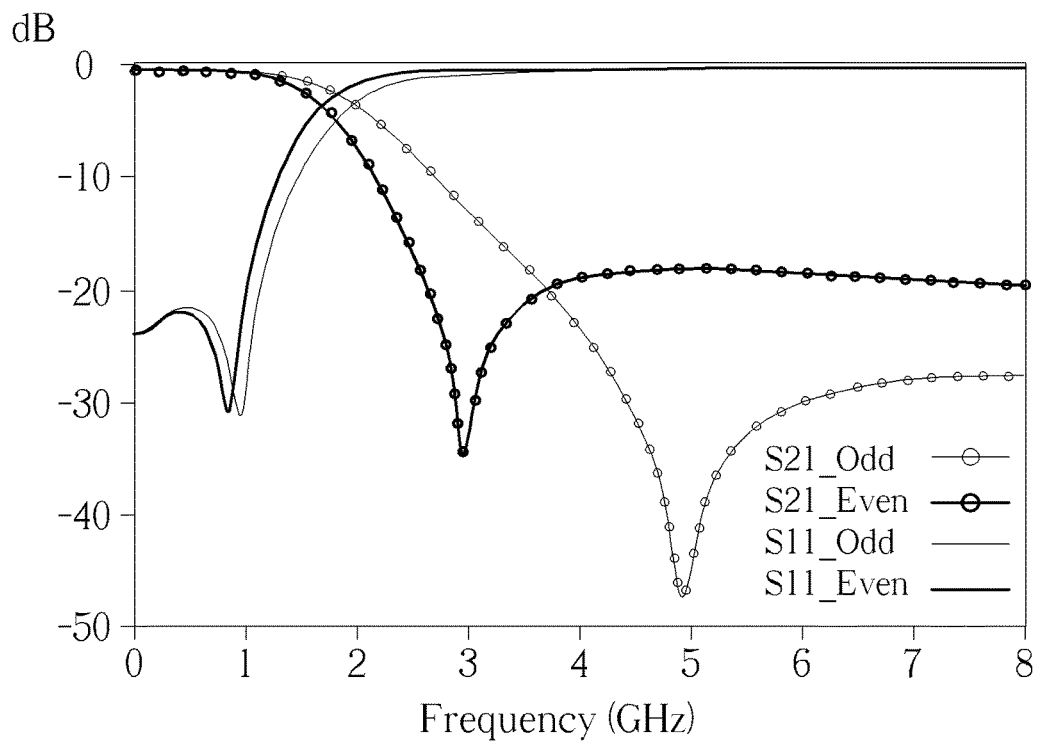

For example, FIG. 3 and FIG. 4 illustrate frequency response simulations of the matching network circuit 20 corresponding to selective inductances and capacitances according to different embodiments of the present invention. FIG. 3 and FIG. 4 illustrate an insertion loss in the common mode (S21_Even denoted with thick line with circles), an insertion loss in the differential mode (S21_Odd denoted with thin line with circles), a return loss in the common mode (S11_Even denoted with thick line), and a return loss in the differential mode (S11_Odd denoted with thin line).

In FIG. 3, given that a fundamental frequency is about 1 GHz, an even harmonic (i.e., common mode resonant frequency) of the fundamental frequency is about 2 GHz, and an odd harmonic (i.e., differential mode resonant frequency) of the fundamental frequency is about 3 GHz.

In the common mode, the return loss is low at the fundamental frequency (1 GHz), and the insertion loss shows a notch at the even harmonic (2 GHz), which means that the RF signal at the fundamental frequency is well matched, and the even harmonic of the RF signal are rejected. In the differential mode, the return loss is low at the fundamental frequency (1 GHz), and the insertion loss shows a notch at the odd harmonic (3 GHz), which means that the RF signal at the fundamental frequency is well matched, and the odd harmonic of the RF signal is rejected in the differential mode.

As a result, in the differential mode and the common mode, the matching network circuit can achieve even harmonic rejection, odd harmonic rejection as well as impedance matching for the fundamental frequency.

In FIG. 4, given that a fundamental frequency is about 1 GHz, an even harmonic (i.e., common mode resonant frequency) of the fundamental frequency is about 3 GHz, and an odd harmonic (i.e., differential mode resonant frequency) of the fundamental frequency is about 5 GHz.

In the common mode, the return loss is low at the fundamental frequency (1 GHz), and the insertion loss shows a notch at the even harmonic (3 GHz), which means that the RF signal at the fundamental frequency matches with the matching network circuit, and the even harmonic of the RF signal are rejected in the common mode. In the differential mode, the return loss is low at the fundamental frequency (1 GHz), and the insertion loss shows a notch at the odd harmonic (5 GHz), which means that the RF signal at the fundamental frequency is well matched, and the odd harmonic of the RF signal is rejected in the differential mode.

As a result, in the differential mode and the common mode, the matching network circuit can achieve even harmonic rejection, odd harmonic rejection as well as impedance matching for the fundamental frequency.

In short, the matching network circuit of present invention includes a differential mode filter with a differential resonant frequency and a passive component coupled to the virtual short circuit node at the differential mode filter, where a common mode filter with a common resonant frequency is constituted by the differential mode filter and the passive component. As a result, the matching network circuit can achieve odd harmonic rejection and even harmonic rejection in the differential mode and the common mode, respectively. Those skilled in the art can make modifications and alterations accordingly, which is not limited.

Figure 5:
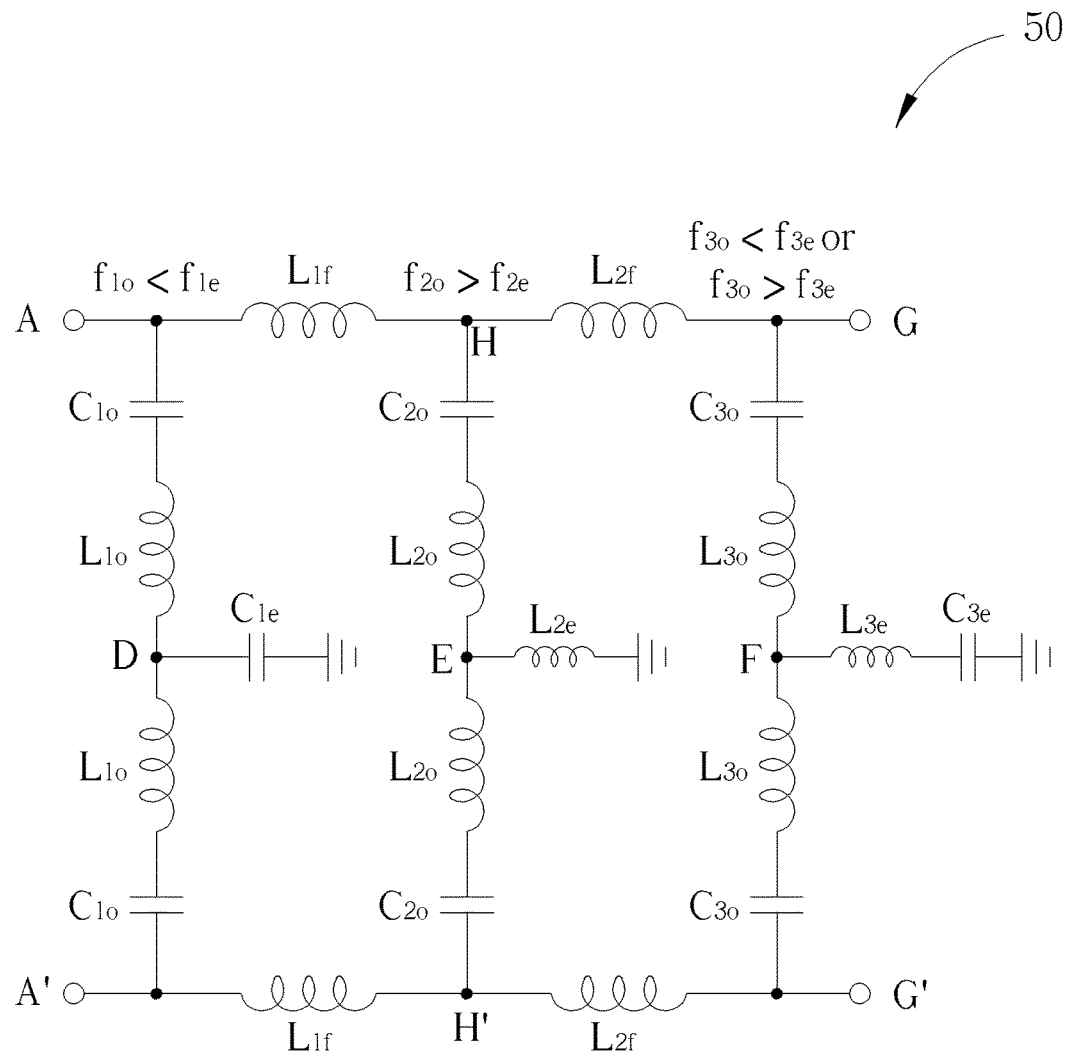
FIG. 5 is a schematic diagram of a matching network according to an embodiment of the present invention.

FIG. 5 is a schematic diagram of a matching network 50 according to an embodiment of the present invention. The matching network 50 includes capacitors $C_{1o}$, $C_{2o}$, $C_{3o}$, $C_{1e}$ and $C_{3e}$, inductors $L_{1o}$, $L_{2o}$, $L_{3o}$, $L_{2e}$, $L_{3e}$, $L_{1f}$ and $L_{2f}$, differential input nodes A and A', differential output nodes G and G', differential intermediate nodes H and H', and symmetry nodes D, E and F. The matching network 50 is structurally symmetric about the nodes D, E and F which behave as a virtual short circuit in the differential mode, and behave as a virtual open circuit in the common mode. The matching network 50 is generic from an LC lowpass matching network, where the inductors $L_{1f}$ and $L_{2f}$ are used for impedance matching for the RF signal.

The capacitors $C_{1o}$ and $C_{1e}$ and the inductor $L_{1o}$ constitute a first-stage matching network circuit shunted between the signal paths of the differential signals (or the differential input nodes A and A'). The capacitor $C_{1o}$ and the inductor $L_{1o}$ operate as a differential mode filter with a differential resonant frequency $f_{1o}$, the capacitor $C_{1e}$ is coupled to the node D, and the capacitors $C_{1o}$ and $C_{1e}$ and the inductor $L_{1o}$ operate as a common mode filter with a common resonant frequency $f_{1e}$.

Note that the common mode resonant frequency $f_{1e}$ is higher than the differential mode resonant frequency $f_{1o}$. In detail, in light of the equations (2.1) and (2.2), the resonant frequency is negatively proportional to an effective capacitance based on the same inductance of the inductor $L_{1o}$. The effective capacitance contributed by the capacitor $C_{1o}$ in series with the capacitor $C_{1e}$, where an overall capacitance of them is decreased for even harmonic rejection, is smaller than the effective capacitance $C_{1o}$ for odd harmonic rejection, which makes the common mode resonant frequency $f_{1e}$ to be higher than the differential mode resonant frequency $f_{1o}$.

The capacitors $C_{2o}$ and the inductors $L_{2o}$ and $L_{2e}$ constitute a second-stage matching network circuit shunted between the signal paths of the differential signals (or the differential intermediate nodes H and H'). The capacitor $C_{2o}$ and the inductor $L_{2o}$ operate as a differential mode filter with a differential resonant frequency $f_{2o}$, the inductor $L_{2e}$ is coupled to the node E, and the capacitor $C_{2o}$ and the inductors $L_{2o}$ and $L_{2e}$ operate as a common mode filter with a common resonant frequency $f_{2e}$. The second matching unit has an identical structure as the matching network circuit 20, and the common mode resonant frequency $f_{2e}$ is lower than the differential mode resonant frequency $f_{2o}$ due to the inductor $L_{2e}$.

The capacitors $C_{3o}$ and $C_{1e}$ and the inductors $L_{3o}$ and $L_{3e}$ constitute a third-stage matching network circuit shunted between the signal paths of the differential signals (or the differential output nodes G and G'). The capacitor $C_{3o}$ and the inductor $L_{3o}$ operate as a differential mode filter with a differential resonant frequency $f_{3o}$, an LC resonator formed by the inductor $L_{3e}$ and the capacitor $C_{3e}$ is coupled to the node F, and the capacitors $C_{3o}$ and $C_{3e}$ and the inductors $L_{3o}$ and $L_{3e}$ operate as a common mode filter with a common resonant frequency $f_{3e}$.

Note that the common mode resonant frequency $f_{3e}$ can be either higher or lower than the differential mode resonant frequency $f_{3o}$. In detail, in light of the equations (2.1) and (2.2), the resonant frequency is negatively proportional to a product of effective capacitance and effective inductance (or effective LC value). The LC resonator formed by the inductor $L_{3e}$ and the capacitor $C_{3e}$ can either decrease or increase the effective LC value based on their values, which makes the common mode resonant frequency $f_{3e}$ to be either higher or lower than the differential mode resonant frequency $f_{3o}$.

The LC resonator formed by the inductor $L_{3e}$ and the capacitor $C_{3e}$ is further used for common mode impedance tuning. Specifically, the third-stage matching network circuit is shunted between differential output nodes G and G' to influence an output impedance of the matching network 50. In the matching network 50, all components which are coupled to virtual short/open node can adjust the common mode output impedance without affecting differential mode output impedance. Since the inductor $L_{3e}$ and the capacitor $C_{3e}$ are effective only in the common mode, the common mode output impedance of the matching network 50 is influenced by the inductor $L_{3e}$ and the capacitor $C_{3e}$. Hence, their LC value of the inductor $L_{3e}$ and the capacitor $C_{3e}$ should be selected by taking the common mode output impedance into consideration.

In one embodiment, the order or locations of the first-stage, second-stage and third-stage matching network circuits can be adjusted according to practical requirement, which is not limited. Or, the passive components of the matching network circuits can be replaced by any types of passive components, which is not limited.

Figure 6:
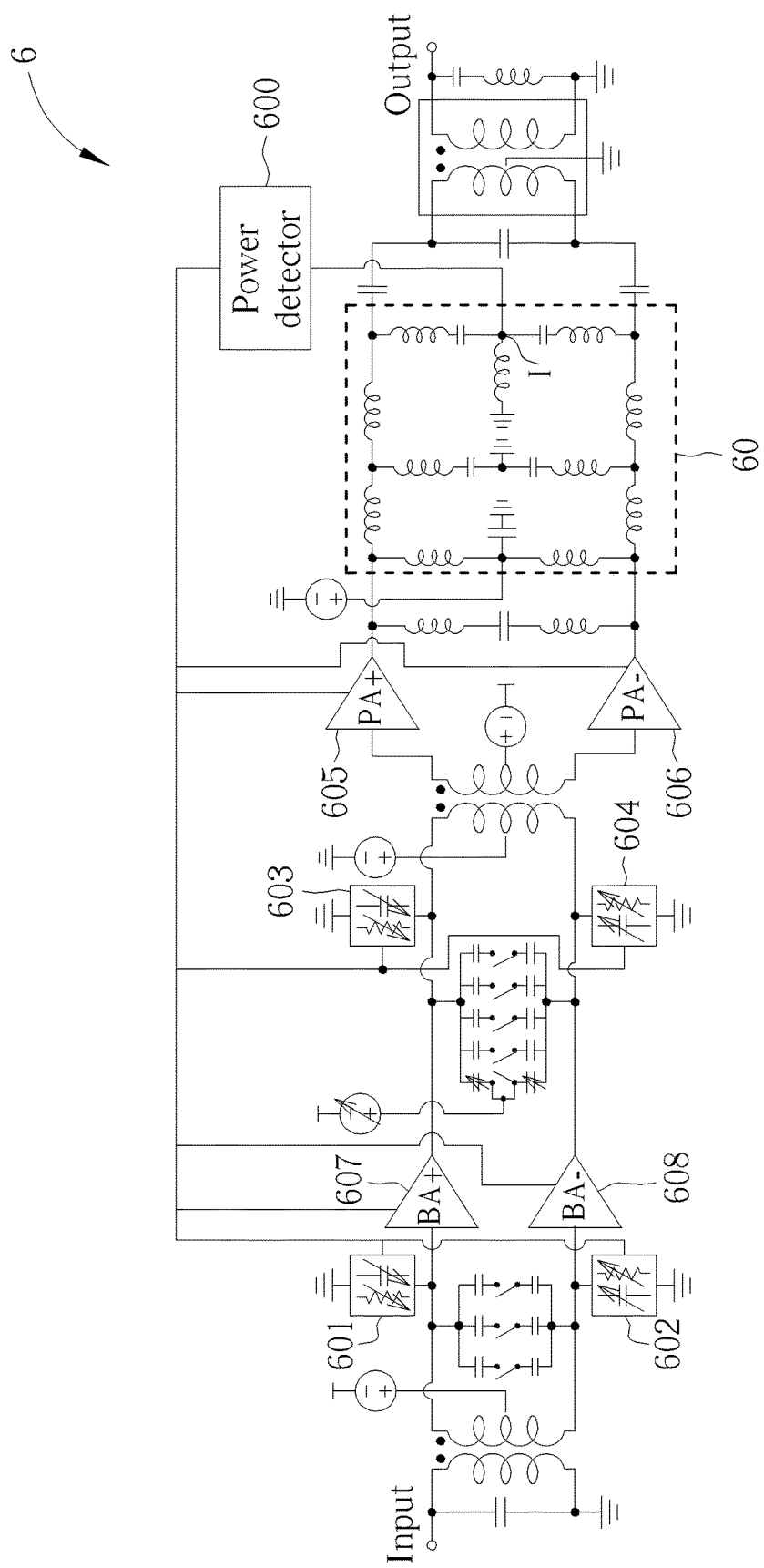
FIG. 6 illustrates three different unit sections with different suppression purposes in a matching network according to an embodiment of the present invention.

FIG. 6 illustrates three different unit sections with different suppression purposes in a matching network of a RF power circuit 6 according to an embodiment of the present invention. Operations of the RF power circuit 6 can be divided into several stages such as input stage, power amplifier (PA) driver stage, PA core stage, matching stage and output stage. In the input stage, the RF signal is inputted to an input node to be split by an input splitter into a pair of differential signals. The phase tuner provides any phase difference adjustment between in-phase signal path and 180-degree out-of-phase path. For example, if the ideal phase delays before phase tuners are 0° at in-phase path and 180° at 180-degree out-of-phase path, the phase delays will become $0°+\Delta\theta_{in\text{-}phase}$ and $180°+\Delta\theta_{out\text{-}phase}$ where $\Delta\theta_{in\text{-}phase}$ and $\Delta\theta_{out\text{-}phase}$ can be any additional phase delay from phase tuner. In the PA driver stage, a pair of power amplifiers 607 and 608 amplifies the differential signals with the same or different bias gains, respectively. In the PA core stage, a pair of power amplifiers 605 and 606 amplifies the differential signals with the same or different gains, respectively. In the matching stage, a matching network 60 provides impedance matching between the PA core stage and the output stage, where odd harmonic and even harmonic signals of the RF signal can be rejected by the matching network 60. In the output stage, the differential signals are converted into a single-ended signal by using an output transformer.

In FIG. 6, the RF power circuit 6 includes the matching network 60, a power detector 600, adjusting circuits 601-604, and the power amplifiers 605-608. In structure, the power detector 600 is coupled to a symmetry node (i.e. node I) of the matching network 60, the adjusting circuits 601-604, and the power amplifiers 605-608. The adjusting circuits 601 and 602 are coupled to the signal paths for the differential signals between the phase tuner and the power amplifiers 607 and 608. The adjusting circuits 603 and 604 are coupled to the signal paths for the differential signals between a PA driver stage phase tuner and the power amplifiers 605 and 606.

In operation, the power detector 600 detects a signal at the symmetry node I, and then generates at least one control signal according to the detected signal. The power detector 600 further outputs the at least one control signal to at least one of the adjusting circuits 601-604 and the power amplifiers 605-608 at the previous stages prior to the matching stage, so as to adjust electric characteristics (including at least one of phase, amplitude, voltage, current and power) of the differential signals, thereby improve the symmetry of the differential signals. Each of the adjusting circuits 601-604 includes a phase shifter and an attenuator, where the phase shifter delays at least one of the differential signals to adjust the phase difference of the differential signals, and the attenuator attenuates at least one of the differential signals to adjust the amplitude difference of the differential signals. The power gain provided by the power amplifiers 605-608 can be controlled independently according to the control signal.

As can be seen in FIG. 6, the RF power circuit 6 provides a close-loop structure between the matching network 60, the power detector 600 and the adjusting circuits 601-604. With the close-loop structure, the phase difference and the amplitude difference between the differential signals can be eliminated by adjusting the electric characteristics of the differential signals at the previous stages according to the detected signal at the later matching stage. In practice, such adjustment can be iteratively performed until the symmetry of the differential signals is satisfied, and hence the differential signals can be well matched. Note that detecting the signal at the symmetry node has a smaller loss impact than detecting the signal at the signal paths of the differential signals.

In one embodiment, the power detector 600 is frequency selective to adjust the symmetry of the differential signals for specific harmonic frequency. For example, the power detector 600 detects the signal with the differential resonant frequency (i.e., odd harmonic frequency) in the differential mode or with the common resonant frequency (i.e., even harmonic frequency) in the common mode.

Further, when performing the detection, even harmonic power is expected to be as large as possible, and odd harmonic power is expected to be as small as possible. Specifically, the symmetry node I behaves as the virtual open circuit in the common mode, and the common mode notch filter resonates the even harmonic, so the signal swing (power or amplitude) of the even harmonic observed at the symmetry node I should be large. On the other hand, the symmetry node I behaves as the virtual short circuit in the differential mode, so the signal swing (power or amplitude) of the odd harmonic observed at the symmetry node I should be small. The signal swing of odd harmonic observed at the symmetry node is small because the virtual short provides very low impedance.

In one embodiment, additional power detectors can be put at other symmetry nodes of the matching network 60 to detect electric characteristics of the differential signals, and adjust at least one of the amplitude difference and phase difference between the signal paths at the previous stages for better output performance.

Figure 7:
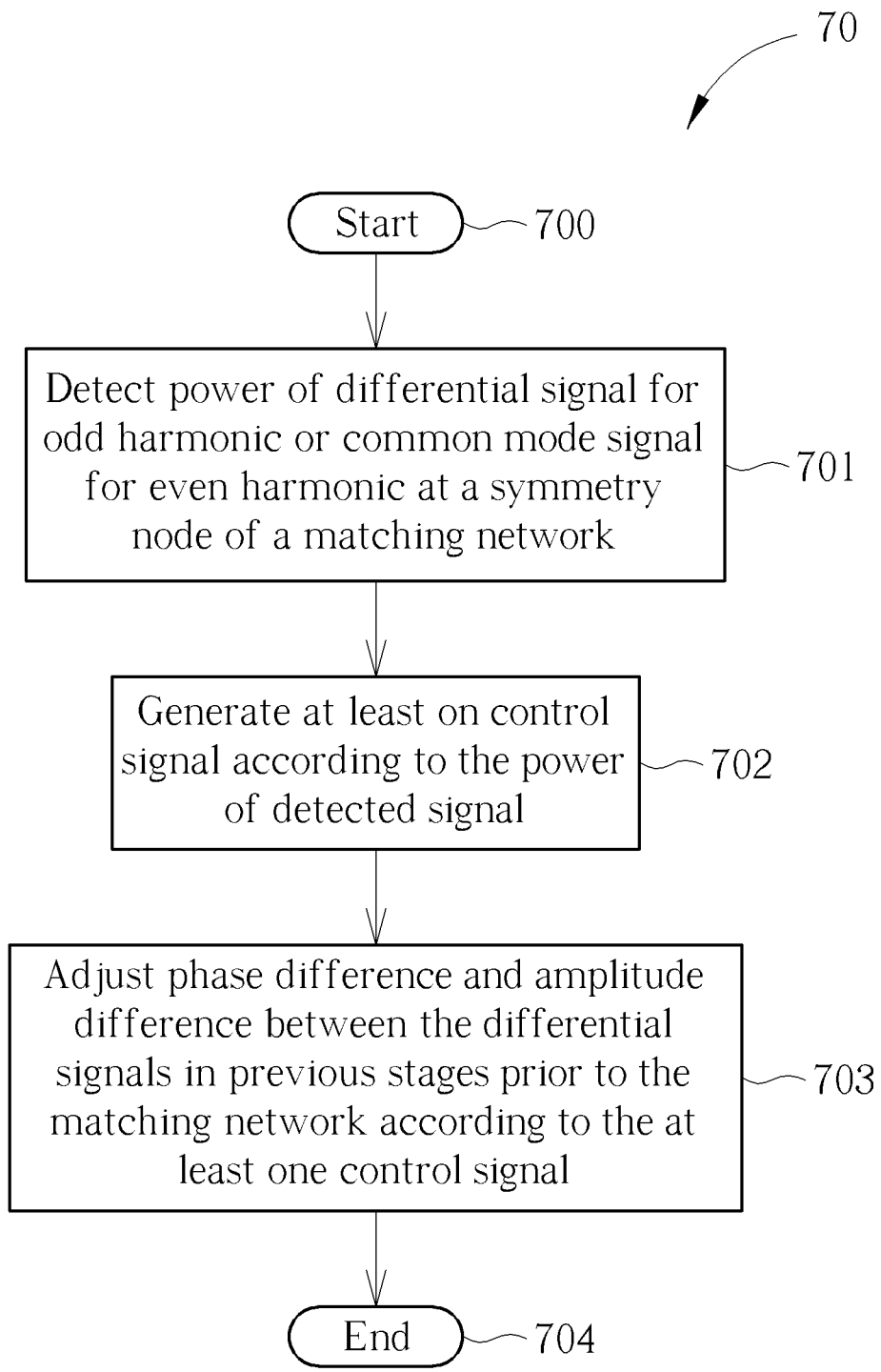
FIG. 7 is a flowchart of a process according to an embodiment of the present invention.

Operations of the RF power circuit 6 for adjusting the symmetry of the differential signals can be summarized in to a process 70 as shown in FIG. 7, and the process 70 includes the following steps.

Step 700: Start.

Step 701: Detect power of differential signal for odd harmonic or common mode signal for even harmonic at a symmetry node of a matching network.

Step 702: Generate at least on control signal according to the power of detected signal.

Step 703: Adjust phase difference and amplitude difference between the differential signals in previous stages prior to the matching network according to the at least one control signal.

Step 704: End.

In the process 70, Steps 701 and 702 are performed by the power detector, and Step 703 is performed by at least one of the adjusting circuit and the power amplifiers. Note that in Step 703, the phase difference and amplitude difference between the differential signals are adjusted in the stages (e.g., input, driver and core stages) prior to the matching stage where the matching network provides impedance tuning and matching. By the process 70, the symmetry of the differential signals can be improved for better output performance of the RF power circuit.

To sum up, the matching network circuit of present invention includes a differential mode filter with a differential resonant frequency and a passive component coupled to the virtual short circuit node at the differential mode filter, thereby a common mode filter with a common resonant frequency is constituted by the differential mode filter and the passive component. As a result, the matching network circuit can achieve odd harmonic rejection and even harmonic rejection in the differential mode and the common mode, respectively. In addition, the present invention provides a method for adjusting the symmetry of the differential signals, which detects power of the differential signals or the common mode signals at the symmetry node of the matching network circuit to adjust the phase difference and amplitude difference between the differential signals in the stages (e.g., input, driver and core stages) prior to the matching stage where the matching network provides impedance tuning and matching. Therefore, the symmetry of the differential signals can be improved for better output performance of the RF power circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A matching network circuit, applied to a radio-frequency (RF) power
    amplifier processing an RF input signal, comprising:
    a first input node for receiving a first signal component of the RF input signal;
    a second input node for receiving a second signal component of the RF input signal;
    a first output node, wherein a first signal path of the first signal component of the RF input signal is formed between the first input node and the first output node;
    a second output node, wherein a second signal path of the second signal component of the RF input signal is formed between the second input node and the second output node;
    a symmetry node;
    a first differential mode notch filter with a differential resonant frequency, coupled between the first signal path of the first signal component of the RF input signal and the symmetry node;
    a second differential mode notch filter with the differential resonant frequency, coupled between the second signal path of the second signal component of the RF input signal and the symmetry node; and
    a passive network circuit, comprising a first passive component, coupled to a ground and the symmetry node;
    wherein a common mode notch filter with a common resonant frequency comprises the passive network circuit and one of the first and second differential mode notch filters.

2. The matching network circuit of claim 1, wherein the passive component comprises a capacitor, and the common resonant frequency is higher than the differential resonant frequency.

3. The matching network circuit of claim 1, wherein the passive component comprises an inductor, and the common resonant frequency is lower than the differential resonant frequency.

4. The matching network circuit of claim 1, wherein the differential mode notch filter comprises an LC resonator.

5. The matching network circuit of claim 1, wherein the symmetry node operates as a virtual short circuit if the matching network circuit operates in a differential mode, and matching network circuit operates as a virtual open circuit if the matching network circuit operates in a common mode.

6. The matching network of claim 1, wherein the first and second signal components of the RF signal comprise a pair of differential signals.

7. The matching network of claim 1, wherein the first and second input nodes are coupled to a power amplifier core stage circuit of the RF power amplifier, and the first and second output nodes are coupled to an output stage circuit of the RF power amplifier.

8. The matching network circuit of claim 1, wherein the passive component comprises an LC resonator, and the common resonant frequency is decided according to an LC value of LC resonator.

9. The matching network circuit of claim 8, wherein the LC resonator is used for common mode impedance tuning of an output impedance of the differential matching network.

* * * * *